US012656908B2

(12) United States Patent
Lee et al.

(10) Patent No.: US 12,656,908 B2
(45) Date of Patent: Jun. 16, 2026

(54) OSCILLATING SIGNAL ADJUSTING CIRCUIT AND METHOD THEREOF

(71) Applicant: Novatek Microelectronics Corp., Hsinchu (TW)

(72) Inventors: Shih Hua Lee, Taichung (TW); Chin-Yuan Tu, Taoyuan (TW)

(73) Assignee: Novatek Microelectronics Corp., Hsinchu (TW)

( * ) Notice: Subject to any disclaimer, the term of this patent is extended or adjusted under 35 U.S.C. 154(b) by 810 days.

(21) Appl. No.: 17/898,393

(22) Filed: Aug. 29, 2022

(65) Prior Publication Data

US 2024/0069675 A1 Feb. 29, 2024

(51) Int. Cl.
*G06F 3/041* (2006.01)
*G06F 1/06* (2006.01)
*H03K 5/00* (2006.01)

(52) U.S. Cl.
CPC ............ *G06F 3/04184* (2019.05); *G06F 1/06* (2013.01); *H03K 5/00006* (2013.01)

(58) Field of Classification Search
CPC .......... G06F 3/04184; G06F 1/06; G06F 1/08; G06F 3/0416; G06F 3/04; H03K 5/00006
See application file for complete search history.

(56) References Cited

U.S. PATENT DOCUMENTS

| | | | |
|---|---|---|---|
| 7,865,177 B2 | 1/2011 | Sorrells et al. | |
| 8,019,291 B2 | 9/2011 | Sorrells et al. | |
| 8,160,534 B2 | 4/2012 | Sorrells et al. | |
| 10,778,235 B2 | 9/2020 | Kirschner | |
| 11,545,934 B2 | 1/2023 | Deng et al. | |
| 2012/0299836 A1* | 11/2012 | Hsieh ...................... | G06F 3/046 |
| | | | 345/173 |
| 2016/0078832 A1* | 3/2016 | Ota ...................... | G09G 3/3655 |
| | | | 345/212 |
| 2019/0173454 A1* | 6/2019 | Jun ........................ | H03L 7/0802 |

(Continued)

FOREIGN PATENT DOCUMENTS

| | | |
|---|---|---|
| TW | 202022555 | 6/2020 |
| TW | 202219687 | 5/2022 |

OTHER PUBLICATIONS

"Notice of allowance of Taiwan Counterpart Application", issued on Apr. 26, 2023, p. 1-p. 3.

*Primary Examiner* — Lunyi Lao
*Assistant Examiner* — Jarurat Suteerawongsa
(74) *Attorney, Agent, or Firm* — JCIPRNET

(57) ABSTRACT

An oscillating signal adjusting circuit is provided. The oscillating signal adjusting circuit is adapted to generate an internal clock signal of a touch and display driver integrated circuit and includes a frequency shift circuit and a spread spectrum control circuit. The frequency shift circuit acquires a first setting data indicated by a mode control signal, and determines whether to shift a frequency of the input clock signal according to the first setting data to generate a first output clock signal. The spread spectrum control circuit to acquires a second setting data indicated by the mode control signal, and determines whether to perform a spreading spectrum operation on the first output clock signal according to the second setting data to generate the internal clock signal. The mode control signal has a first voltage level in a display period and has a second voltage level in a touch sensing period.

26 Claims, 6 Drawing Sheets

(56)     References Cited

U.S. PATENT DOCUMENTS

| 2020/0136629 | A1  | 4/2020 | Kirschner |            |
|--------------|-----|--------|-----------|------------|
| 2020/0278782 | A1* | 9/2020 | Chan      | G06F 3/04182 |
| 2021/0083666 | A1* | 3/2021 | Matalon   | H03K 5/135 |
| 2022/0149786 | A1  | 5/2022 | Deng et al. |          |

* cited by examiner

100

OSCILLATING SIGNAL ADJUSTING CIRCUIT AND METHOD THEREOF

BACKGROUND

Technical Field

The disclosure relates to signal adjusting circuit; particularly, the disclosure relates to an oscillating signal adjusting circuit and an oscillating signal adjusting method.

Description of Related Art

Oscillators are widely used in the electronic devices to provide clock signals. However, while an electronic device receive data via a wireless communication, if the frequency of the clock signal of the oscillator falls within the communication frequency band of the wireless communication, an electromagnetic interference may occur, and thereby causing errors in the electronic device.

SUMMARY

The disclosure is direct to an oscillating signal adjusting circuit and an oscillating signal adjusting method, so as to reduce the electromagnetic interference to the electronic device caused by the oscillator.

In the disclosure, the oscillating signal adjusting circuit is adapted to generate an internal clock signal of a touch and display driver integrated circuit. The oscillating signal adjusting circuit includes a frequency shift circuit and a spread spectrum control circuit. The frequency shift circuit is configured to receive an input clock signal and a mode control signal, acquire a first setting data indicated by the mode control signal, and determine whether to shift a frequency of the input clock signal according to the first setting data to generate a first output clock signal. The spread spectrum control circuit is coupled to the frequency shift circuit, configured to receive the first output clock signal and the mode control signal, acquire a second setting data indicated by the mode control signal, and determine whether to perform a spreading spectrum operation on the first output clock signal according to the second setting data to generate the internal clock signal. The mode control signal has a first voltage level in a display period and has a second voltage level in a touch sensing period.

In the disclosure, the oscillating signal adjustment method is adapted to an oscillation circuit generating an internal clock signal of a touch and display driver integrated circuit and includes: receiving an input clock signal and a mode control signal; acquiring a first setting data indicated by the mode control signal; determining whether to shift a frequency of the input clock signal according to the first setting data to generate a first output clock signal; acquiring a second setting data indicated by the mode control signal; and determine whether to perform a spreading spectrum operation on the first output clock signal according to the second setting data to generate the internal clock signal, wherein the mode control signal has a first voltage level in a display period and has a second voltage level in a touch sensing period.

Based on the above, according to the oscillating signal adjusting circuit and the oscillating signal adjusting method of the disclosure, the frequency of the clock signal provided by the oscillator is shifted and spread. Therefore, the electromagnetic interference to an electronic device caused by the oscillator in a touch and display driver IC utilized in the electronic device (such as mobile phone or laptop) is reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
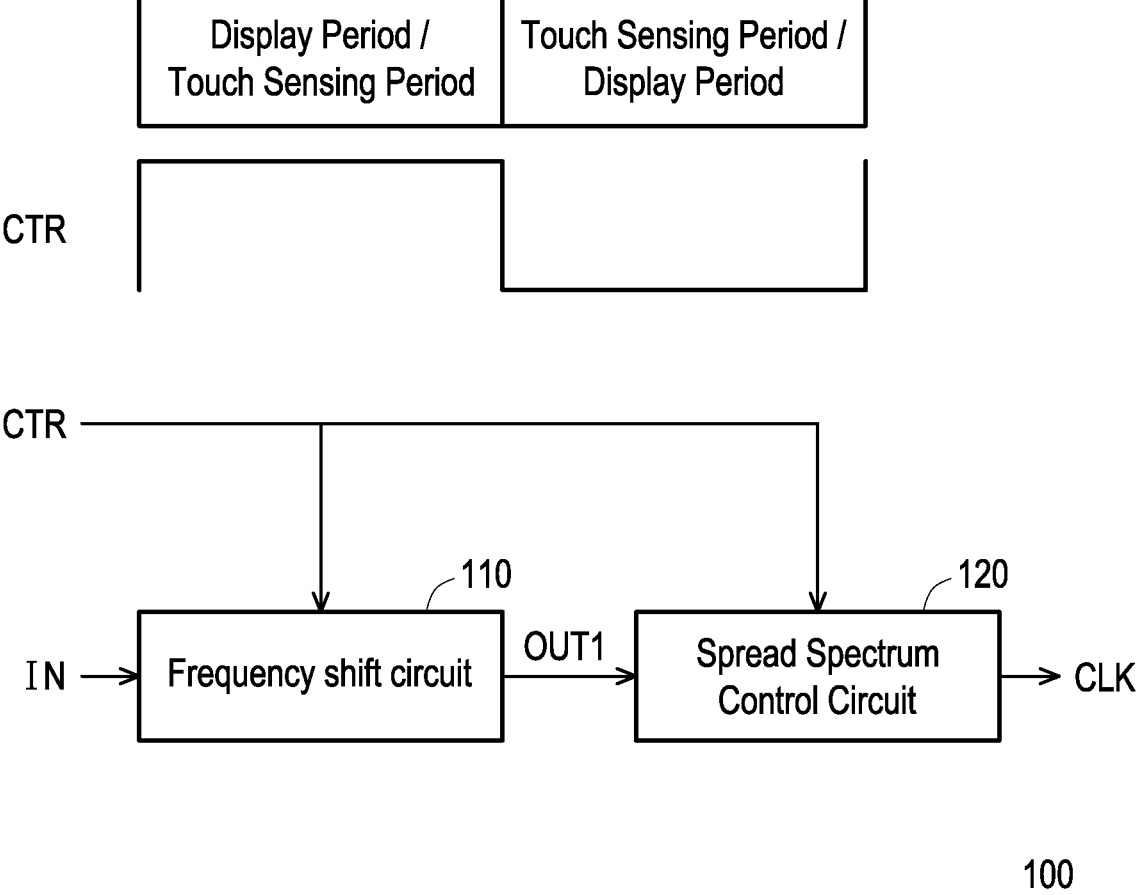
FIG. 1 is a schematic diagram of an oscillating signal adjustment circuit according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

FIG. 1 is a schematic diagram of an oscillating signal adjustment circuit according to an embodiment of the disclosure. With reference to FIG. 1, the oscillating signal adjusting circuit 100 is adapted to generate an internal clock signal CLK of a touch and display driver integrated circuit (IC). The oscillating signal adjusting circuit 100 is in the touch and display driver IC and includes a frequency shift circuit 110 and a spread spectrum control circuit 120. The frequency shift circuit 110 is configured to receive an input clock signal IN and a mode control signal CTR. The frequency shift circuit 110 is configured to acquire a first setting data indicated by the mode control signal CTR, and determine whether to shift a frequency of the input clock signal IN according to the first setting data to generate a first output clock signal OUT1. The spread spectrum control circuit 120 is coupled to the frequency shift circuit 110. The spread spectrum control circuit 120 is configured to receive the first output clock signal OUT1 and the mode control signal CTR. The spread spectrum control circuit 120 is configured to acquire a second setting data indicated by the mode control signal CTR, and determine whether to perform a spreading spectrum operation on the first output clock signal OUT1 according to the second setting data to generate the internal clock signal CLK. The mode control signal CTR has a first voltage level in a display period and has a second voltage level in a touch sensing period.

In one embodiment, a voltage level of the mode control signal alternates between a high level and a low level. Periods of the mode control signal CTR staying in one of the high level and the low level indicates the display periods. Periods of the mode control signal CTR staying in the other one of the high level and the low level indicates the touch sensing periods. In one embodiment, the first voltage level is the high level and the second voltage level is the low level.

In another embodiment, the first voltage level is the low level and the second voltage level is the high level.

In one embodiment, each of functions of the frequency shift circuit 110 or a spread spectrum control circuit 120 may be achieved by multiple program codes, or one or more digital circuits or mix-signal circuits in the touch and display driver IC. The program codes are stored in a memory, and executed by the frequency shift circuit 110 or a spread spectrum control circuit 120. The disclosure does not limit the use of software or hardware to achieve the functions of the frequency shift circuit 110 or a spread spectrum control circuit 120.

In one embodiment, the input clock signal IN is a clock signal provided by a mobile industry processor interface (MIPI) of an application processor (AP), but this disclosure is not limited thereto. In one embodiment, the frequency of the input clock signal IN being shifted or the frequency of the first output clock signal OUT1 being spread may be the fundamental frequency of the input clock signal IN or the fundamental frequency of the first output clock signal OUT1 respectively, but the disclosure is not limited thereto. In one embodiment, internal clock signal CLK is provided to different back stage circuits through a clock divider, but this disclosure is not limited thereto. That is, the frequency of the internal clock signal CLK may be adjusted to different frequencies to be provided to different back stage circuits.

Therefore, the electromagnetic interference to an electronic device such as a mobile phone caused by the oscillating signal of an oscillator in the touch and display driver IC falling within a communication frequency band may be reduced and thereby improving the quality of the communication signal of the electronic device.

Figure 2A:
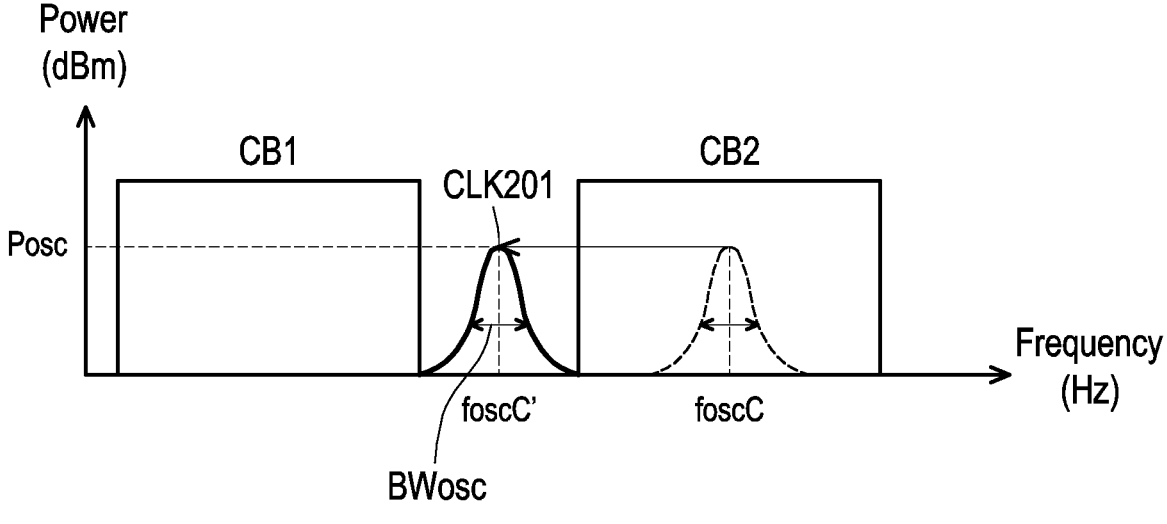
FIG. 2A is a schematic diagram of a frequency spectrum of an oscillating signal according to an embodiment of the disclosure.

FIG. 2A is a schematic diagram of a frequency spectrum of an oscillating signal according to an embodiment of the disclosure. In one embodiment, an electronic device such as a mobile phone includes a wireless communication transceiver such as 4G or 5G communication transceiver and a touch display screen driven by a touch and display driver IC including an oscillator. The wireless communication transceiver is configured to transceiver data via wireless communication. The oscillator is configured to provide a clock signal (a.k.a. oscillating signal) used in the touch and display driver IC.

With reference to FIG. 2A, the horizontal axis indicates the frequency (Hz) and the vertical axis indicates the power (dBm). The wireless communication transceiver may transceive data using a first communication frequency band CB1 and a second communication frequency band CB2. A clock signal CLK201 provided by the oscillator may be a rectangular wave signal and have a fundamental frequency, and power (peak power) corresponding to the fundamental frequency and harmonics of the clock signal CLK201 can be depicted as a curve in the FIG. 2. When the fundamental frequency foscC of the clock signal CLK201 is at a frequency position in the first communication frequency band CB2 which results in harmonics almost falling in the first communication frequency band CB2, more electromagnetic interference may be brought to the electronic device and thereby reducing the quality of communication signals or other signals in the electronic device. For example, the display quality and/or the touch sensing accuracy of the electronic device as the touch and display driver IC may be reduced.

With reference to FIG. 1 and FIG. 2A, it is advantageous to reduce or avoid the electromagnetic interference by shifting the fundamental frequency foscC of the clock signal CLK201 by the frequency shift circuit 110 according to the first setting data acquired from the mode control signal CTR. The fundamental frequency of the clock signal CLK201 may be shifted to a frequency foscC' which results in harmonics falling outside the first communication frequency band CB1 and also outside the second communication frequency band CB2. Since the frequency spectrum of the clock signal CLK201 does not overlap with the first communication frequency band CB1 or the second communication frequency band CB2, an electromagnetic interference to an electronic device such as a mobile phone caused by the oscillator in the touch and display driver IC is reduced and thereby improving the quality of signal in the electronic device.

However, in another embodiment, the bandwidth BWosc of the clock signal CLK201 may be wide, so the clock signal CLK202 (clock signal CLK201 after shifting) still overlap with the first communication frequency band CB1 and/or the second communication frequency band CB2. That is, although the electromagnetic interference is reduced, but may still interfere with other signals in the electronic device. In addition, in the other embodiment, the clock signal CLK201 may not be able to be shifted further due to the limitation of the processing frequency of the oscillator, so that the clock signal CLK201 may not be able to be moved out of the first communication frequency band CB1 and the second frequency communication frequency band CB2. Therefore, some electromagnetic interference may still exist. To further reduce the influence of the electromagnetic interference, a spreading spectrum operation may be performed.

Figure 2B:
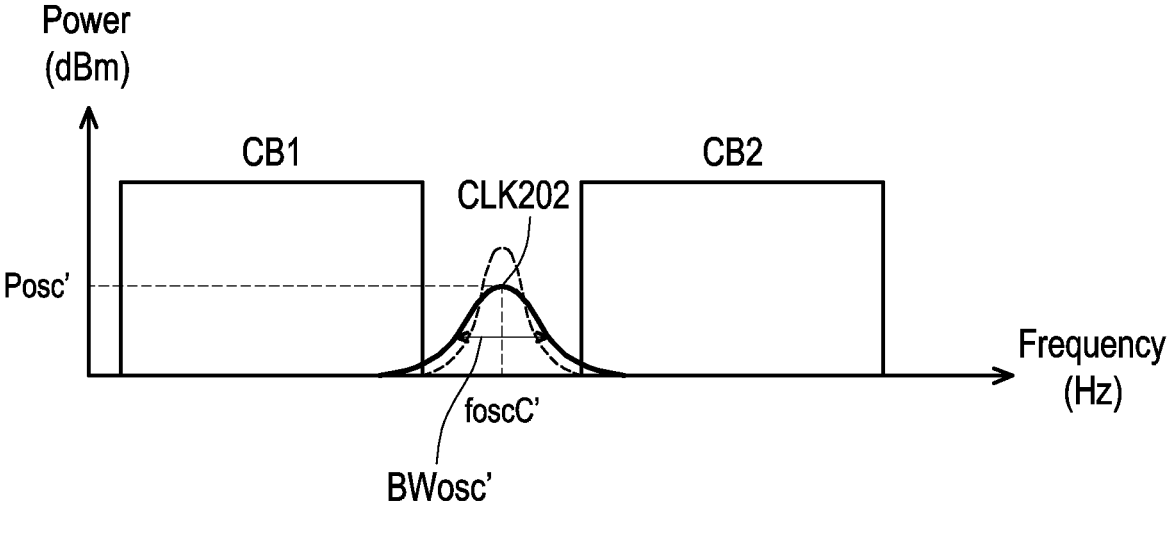
FIG. 2B is a schematic diagram of a frequency spectrum of an oscillating signal according to an embodiment of the disclosure.

FIG. 2B is a schematic diagram of a frequency spectrum of an oscillating signal according to an embodiment of the disclosure. With reference to FIG. 1 to FIG. 2B, a spreading spectrum operation is performed by the spread spectrum control circuit 120 on a clock signal CLK202 according to the second setting data acquired from the mode control signal CTR. The clock signal CLK202 may have the fundamental frequency foscC', a bandwith BWosc', and a peak power Posc'. Specifically, the peak power Posc' of the clock signal CLK202 is smaller than a peak power of the clock signal CLK202 before spreading spectrum operation, and the bandwidth BWosc' of the clock signal CLK202 is wider than a bandwidth of the clock signal CLK202 before spreading spectrum operation. That is, after the spreading spectrum operation, harmonics of the clock signal CLK202 is distributed in a wider range and thereby decreasing the value of the peak power of the clock signal CLK202, thereby reducing the influence of the electromagnetic interference to an electronic device such as a mobile phone caused by the oscillating signal in the touch and display driver IC.

In one embodiment, the first setting data and the second setting data may be determined based on the communication frequency bands (e.g., communication frequency band CB1 and communication frequency band CB2) of the wireless communication transceiver. That is, once the wireless communication transceiver is determined, the first setting data and the second setting may be predetermined.

Regarding to a touch and display driver integrated circuit in an electronic device, a frame period (or a display frame period, in view of display driving function) may be divided in to multiple display periods and multiple touch sensing periods which are alternately arranged, and at the end of a frame period, a display frame is completely displayed and the touch sensing function are performed on full of the touch sensor array in the touch display panel once or more times, which are taken as one or more touch sensing frames. For illustrating purpose, only several display periods DP and sensing periods TP alternatively arranged are depicted in FIGS. 3A-3C, 4A-4C, 5A-5C, but this disclosure is not limited thereto.

Figures 3A, 3B, 3C:
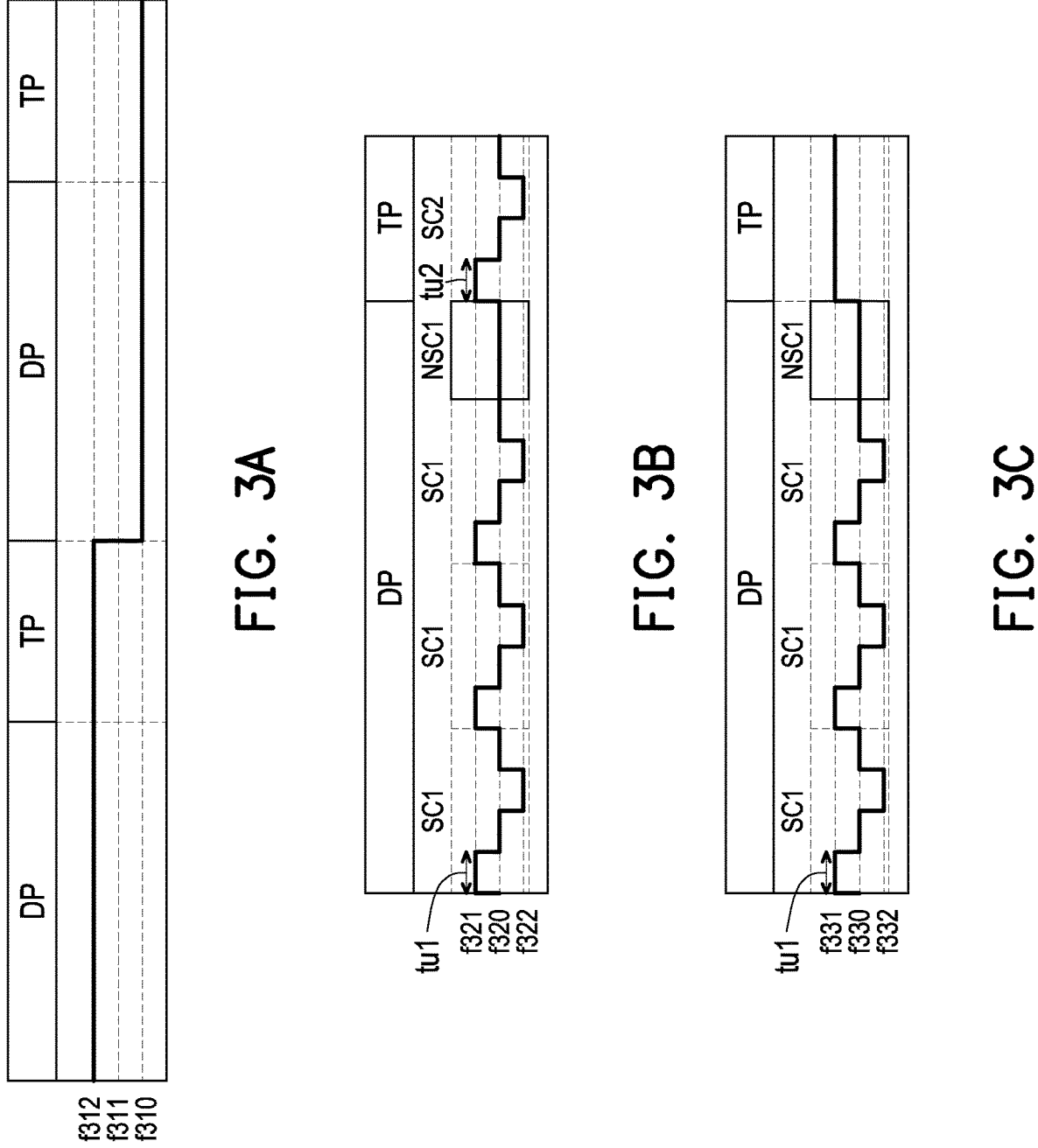
FIG. 3A is a schematic diagram of frequency setting of an oscillating signal according to an embodiment of the disclosure.
FIG. 3B is a schematic diagram of frequency setting of an oscillating signal according to an embodiment of the disclosure.
FIG. 3C is a schematic diagram of frequency setting of an oscillating signal according to an embodiment of the disclosure.

FIG. 3A is a schematic diagram of frequency setting of an oscillating signal according to an embodiment of the disclosure. FIG. 3B is a schematic diagram of frequency setting of an oscillating signal according to an embodiment of the disclosure. FIG. 3C is a schematic diagram of frequency setting of an oscillating signal according to an embodiment of the disclosure. In one embodiment, an oscillating signal as the input clock signal IN may be processed by the frequency shift circuit 110 and the spread spectrum control circuit 120 of the oscillating signal adjust circuit 100 of FIG. 1 to generate an internal clock signal CLK. FIG. 3A to FIG. 3C are some embodiments that how the input clock signal IN is processed by the frequency shift circuit 110 and the spread spectrum control circuit 120, but this disclosure is not limited thereto.

With reference to FIG. 1 and FIG. 3A, the horizontal axis indicates the time and the vertical axis indicates the frequency. A frame period of a touch and display driver integrated circuit in an electronic device is depicted.

In one embodiment of FIG. 3A, the first setting data regarding to frequency shift may be determined based on the specifications of the touch and display driver integrated circuit and the wireless communication transceiver of the electronic device. Specifically, the first setting data is configured to move the harmonics of the input clock signal IN, as much time as possible, out of the communication frequency bands of the wireless communication transceiver. Thus, a time length of the display period DP varies and/or a time length of the touch sensing period TP varies due to the frequency shift of the input clock signal IN. Further, based on a fact that a frame rate may be fixed for at least a period of time, the first setting data is configured to make the sum of time length of the plurality of display periods DP and the plurality of touch sensing periods TP unchanged. In the embodiment of FIG. 3A, a frequency f311 may be a fundamental frequency of the input clock signal IN before frequency shift, frequency f312 may be may be a fundamental frequency of the input clock signal IN after frequency shift which may bring harmonics of the input clock signal IN output of the communication frequency band, and frequency f310 may be may be a fundamental frequency of the input clock signal IN after frequency shift which may keep harmonics of the input clock signal IN still in the communication frequency band.

With reference to FIG. 1 and FIG. 3B, at least one of the display periods DP comprises a plurality of first spreading cycles SC1 and a first non-spreading period NSC1. Each of the first spreading cycle SC1 includes a plurality of first time units tu1 and the first non-spreading period NSC1 is shorter than each of the spreading cycles SC1. In one embodiment, at least one of the touch sensing periods TP comprises at least one second spreading cycle SC2, and the second spreading cycle SC2 comprises a plurality of second time units tu2.

In the embodiment, the display periods DP includes three first spreading cycles SC1 and one first non-spreading period NSC1, but the number of the first spreading cycle SC1 and the first non-spreading period NSC1 is not limited thereto. In the embodiment, the first spreading cycles SC1 and the second spreading cycle SC2 respectively include four first time units tu1 and four second time units tu2, but the number of the first time units tu1 and second time units tu2 is not limited thereto. In one embodiment, a time length of one first time unit tu1 is same as a time length of one second time unit tu2, but the disclosure is not limited thereto.

The second setting data is regarding to spreading spectrum and may be determined based on the specifications of the touch and display driver integrated circuit and the wireless communication transceiver of the electronic device. During the display period DP, the spread spectrum control circuit 120 determines whether to perform the spreading spectrum operation according to the second setting data acquired from the mode control signal CTR. The second setting data is associated with the display periods DP. The spreading spectrum operation includes shifting a frequency of the first output clock signal OUT1 during each of the time units tu1 to a respective frequency of a plurality of frequencies according to the second setting data, to generate the internal clock signal CLK in one first spreading cycle SC1 which varies among the plurality of frequencies. The plurality of frequencies during the first spreading cycle SC1 may be called the first spreading frequencies.

In one embodiment, the first spreading frequencies during one first spreading cycle SC1 are configured to have an average value of the first spreading frequencies same as an average value of the frequencies of the first output clock signal OUT1. In another embodiment, the first spreading frequencies during multiple first spreading cycles SC1 are configured to have an average value of the first spreading frequencies same as an average value of the frequencies of the first output clock signal OUT1. In other words, after the spreading spectrum operation, the average value of the frequencies of the internal clock signal CLK is same as the average value of the frequencies of the first output clock signal OUT1.

In one embodiment, the spreading spectrum operation during the display period DP is performed as many as possible unless the remaining time is shorter than one first spreading cycle SC1. The remaining time shorter than one first spreading cycle SC1 is called the non-spreading period NSC1. Since the spreading spectrum operation is not performed all the time during the display period DP, the total of time length of the display period DP may remain the same after the spreading spectrum operation. That is, the display quality of the touch and display driver integrated circuit does not decrease when the electromagnetic interference is reduced by the spreading spectrum operation.

During the touch sensing period TP, the spread spectrum control circuit 120 determines whether to perform the spreading spectrum operation according to the second setting data acquired from the mode control signal CTR. That is, the second setting data is associated with the touch sensing periods TP. The spreading spectrum operation includes shifting a frequency of the first output clock signal OUT1 during each of the time units tu2 to a respective frequency of a plurality of frequencies according to the second setting data, to generate the internal clock signal CLK in one second spreading cycle SC2 which varies among the plurality of frequencies. The plurality of frequencies during the second spreading cycle SC2 may be called the second spreading frequencies.

In one embodiment, the second spreading frequencies during one second spreading cycle SC2 are configured to have an average value of the second spreading frequencies same as a an average value of the frequencies of the first output clock signal OUT1. In another embodiment, the second spreading frequencies during multiple first spreading cycles SC2 are configured to have an average value of the second spreading frequencies same as an average value of the frequencies of the first output clock signal OUT1. In other words, after the spreading spectrum operation, the average value of the frequencies of the internal clock signal CLK is same as the average value of the frequencies of the first output clock signal OUT1.

In one embodiment, the spreading spectrum operation during the touch sensing period DP is performed. Since the average value of the frequencies of the internal clock signal CLK is same as the average value of the frequencies of the first output clock signal OUT1, the total of time length of the plurality of touch sensing periods TP in one frame period may remain the same after the spreading spectrum operation. That is, the touch sensing accuracy of the touch and display driver integrated circuit does not decrease when the electromagnetic interference is reduced by the spreading spectrum operation.

Referring to FIG. 3B, a frame period of a touch and display driver integrated circuit in an electronic device is depicted. During one first spreading cycle SC1 of a display period DP, the frequency of the first output clock signal OUT1 is shifted from an original (predetermined) frequency f320 to the first spreading frequencies f321, f322 by the spread spectrum control circuit 120. In a first time unit tu1 of a first spreading cycle SC1, according to the second setting data, the first output clock signal OUT1 is shifted (increased) to a frequency f321 (respective frequency) of the plurality of spreading frequencies by the spread spectrum control circuit 120. In the next time unit tu1 of the same first spreading cycle SC1, according to the second setting data, the first output clock signal OUT1 is shifted (decreased) to the frequency f320 (respective frequency) of the plurality of spreading frequencies by the spread spectrum control circuit 120. In the next time unit tu1 of the same first spreading cycle SC1, according to the second setting data, the first output clock signal OUT1 is shifted (decreased) to the frequency f322 (respective frequency) of the plurality of spreading frequencies by the spread spectrum control circuit 120. In the next time unit tu1 of the same first spreading cycle SC1, according to the second setting data, the first output clock signal OUT1 is shifted (increased) to the frequency f320 (respective frequency) of the plurality of spreading frequencies by the spread spectrum control circuit 120. That is, the average value of the frequencies of the first output clock signal OUT1 after the spreading spectrum operation (i.e., the internal clock signal CLK) is same as the average value of the frequencies of the first output clock signal OUT1 before the spreading spectrum operation.

In one embodiment, the frequency difference between the frequency f320, the frequency f321, and the frequency f322 may be the same. That is, the amount of the frequency increment from the frequency f320 to the frequency f321 is same as the amount of the frequency deduction from the frequency f320 to the frequency f322. In one embodiment, the frequency increment may be plus one percent of the frequency of the first output clock signal OUT1 and the frequency deduction may be minus one percent of the frequency of the first output clock signal OUT1. In the embodiment, the arrangement of frequency steps, which represents the spreading frequencies, during the first spreading cycle SC1 may be +1, −1, −1, +1 and therefore the average value of frequency steps is 0. In another embodiment, the arrangement of the frequency steps during the first spreading cycle SC1 may be −1, +1, −1, +1 and therefore the average value of frequency steps is 0. In the other embodiment, the arrangement of the frequency steps during the odd ones of the first spreading cycles SC1 may be +1, −1, −1, +1 and the arrangement of the frequency steps during the even ones of the first spreading cycles SC1 may be −1, +1, −1, +1.

That is, the frequency of the output clock signal OUT1 after the spreading spectrum operation (i.e., the internal clock signal CLK) varies more among the plurality of spreading frequencies, and therefore the electromagnetic interference may be further reduced.

The arrangement of the spreading frequencies of the next first spreading cycle SC1 may be same as or different from the earlier first spreading cycle SC1, and this disclosure is not limited thereto. During the first non-spreading period NSC1, since the first non-spreading period NSC1 is shorter than each of the first spreading cycles SC1, no spreading spectrum operation is performed and the frequency of the first output clock signal OUT1 is still the frequency f320.

During the touch sensing period TP, at a beginning of a second time unit tu2 of a second spreading cycle SC2, according to the second setting data, the first output clock signal OUT1 is shifted (increased) to a frequency f321 (respective frequency) of the plurality of first spreading frequencies by the spread spectrum control circuit 120. Similarly, during the remaining time units tu2 of the second spreading cycle SC2, the spreading spectrum operation is performed respectively. The arrangement of the spreading frequencies of the second spreading cycle SC2 may be same as or different from the first spreading cycle SC1, and this disclosure is not limited thereto. Therefore, the touch sensing accuracy of the touch and display driver integrated circuit does not decrease when the electromagnetic interference is reduced by the spreading spectrum operation.

It is noted that, in one embodiment, at the beginning of the frame period, the frequency the first output clock signal OUT1 (frequency f320) may be already shifted by the frequency shift circuit 110. That is, the frequency of the first output clock signal OUT1 may be different from the input clock signal IN, and the disclosure is not limited thereto. In other words, the input clock signal IN may be shifted and spread in a same display period DP. In another embodiment, at the beginning of the frame period, the frequency of the first output clock signal OUT1 (frequency f320) is not shifted by the frequency shift circuit 110 yet. That is, the frequency of the first output clock signal OUT1 is same as the input clock signal IN. In other words, the input clock signal IN may be shifted and spread in different display periods DP. In addition, the frequency shift and the spreading spectrum operation may be performed at the beginning of each of the display periods or the touch sensing periods, and alternatively, the frequency shift and the spreading spectrum operation may also be performed after a while of the beginning of each of the display periods or the touch sensing periods. This disclosure is not limited thereto.

With reference to FIG. 1 and FIG. 3C, a frame period of a touch and display driver integrated circuit in an electronic device is depicted. Compared to the frame period in FIG. 3B, the difference of the frame period in FIG. 3C is that during the touch sensing period TP, no spreading spectrum operation is performed by the spread spectrum control circuit 120, but the frequency of the first output clock signal OUT1 is shifted by the frequency shift circuit 110. In addition, the implementation details of the oscillating signal of the display period DP in FIG. 3C may be referred to the descriptions of the display period DP in FIG. 3B to obtain sufficient teachings, suggestions, and implementation embodiments, while the details are not redundantly described seriatim herein.

During the touch sensing period TP, according to the first setting data, the first output clock signal OUT1 is shifted to a frequency f331 higher than the original (predetermined) frequency f330 by the frequency shift circuit 110. That is, the spreading spectrum operation is only performed by the spread spectrum control circuit 120 during the display period DP, and only the frequency shift is perform by the frequency shift circuit 110 during the touch sensing period TP. During a next touch sensing period TP (not shown in FIG. 3C), the first output clock signal OUT1 may be shifted to a frequency f332 lower than the original frequency f330 by the frequency shift circuit 110, such that the average frequency of the first output clock signal OUT1 in the plurality of touch sensing periods in one frame period may kept the same as the frequency f330. It is noted that, the first setting data and the second setting data (of the mode control signal CTR) may be determined based on the communication frequency bands (e.g., communication frequency band CB1 and communication frequency band CB2) of the wireless communication transceiver, and the requirements of the display quality and the touch sensing accuracy of the touch and display driver integrated circuit according to the design needs. That is, once the wireless communication transceiver and the touch and display driver integrated circuit are determined, the first setting data and the second setting may be predetermined.

Figure 4A:
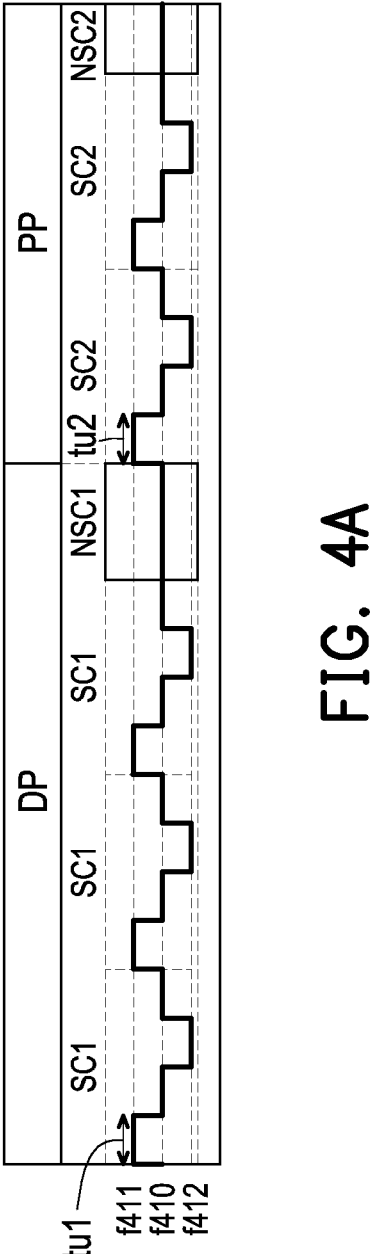
FIG. 4A is a schematic diagram of frequency setting of an oscillating signal according to an embodiment of the disclosure.
Figure 4B:
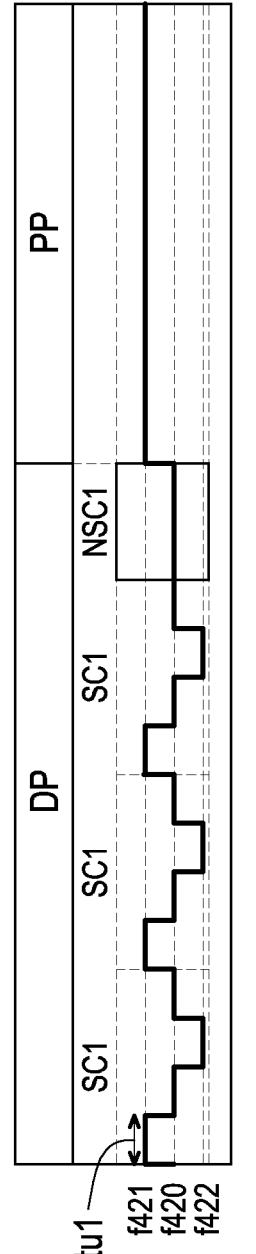
FIG. 4B is a schematic diagram of frequency setting of an oscillating signal according to an embodiment of the disclosure.

FIG. 4A is a schematic diagram of frequency setting of an oscillating signal according to an embodiment of the disclosure. FIG. 4B is a schematic diagram of frequency setting of an oscillating signal according to an embodiment of the disclosure. In one embodiment, the input clock signal IN may be processed by the frequency shift circuit 110 and the spread spectrum control circuit 120 of the oscillating signal adjust circuit 100 of FIG. 1 to generate an internal clock signal CLK. FIG. 4A to FIG. 4B are some embodiments that how the input clock signal IN is processed by the frequency shift circuit 110 and the spread spectrum control circuit 120, but this disclosure is not limited thereto.

In one embodiment, one frame period may include one display period DP (in which all horizontal display lines sequentially displayed) and a porch period PP (in which there is no display data). Porch period PP is also a vertical blanking period. In a porch mode of the touch and display driver integrated circuit, the touch sensing is performed during porch periods PP. It is noted that, a porch period PP may be defined as a time length between an end of a display period DP and a beginning of a next display period DP. That is, the entire porch period PP may be between two adjacent display periods DP. In one embodiment, a part of the porch period PP is located in a current frame period and the other part of the porch period is located in a next frame period. In addition, the time length of a porch period PP may be predetermined based on a display refresh rate of a touch display panel. When the display refresh rate is variable, which is called variable refresh rate (VRR), the time length of the porch period may be also variable.

With reference to FIG. 1 and FIG. 4A, the frame period is depicted again. The frame period includes the display period DP and the porch period PP as the touch sensing period TP. In one embodiment, the display period DP includes a plurality of first spreading cycles SC1 and a first non-spreading period NSC1. Each of the first spreading cycle SC1 includes a plurality of time units tu1, and the first non-spreading period NSC1 is shorter than each of the first spreading cycles SC1. In one embodiment, the touch sensing period TP includes a plurality of second spreading cycles SC2 and a second non-spreading period NSC2. Each of the second spreading cycle SC2 includes a plurality of time units tu2 and the second non-spreading period NSC2 is shorter than each of the second spreading cycles SC2.

In the embodiment, the display periods DP includes three first spreading cycles SC1 and one first non-spreading period NSC1, but the number of the first spreading cycle SC1 and the first non-spreading period NSC1 is not limited thereto. In the embodiment, the porch period PP (touch sensing period TP) includes two second spreading cycles SC2 and one second non-spreading period NSC2, but the number of the second spreading cycle SC2 and the second non-spreading period NSC2 is not limited thereto. In the embodiment, the first spreading cycles SC1 and the second spreading cycle SC2 respectively include four first time units tu1 and four second time units tu2, but the number of the first time units tu1 and second time units tu2 is not limited thereto. In one embodiment, a time length of one first time unit tu1 is same as a time length of one second time unit tu2, but the disclosure is not limited thereto.

During the display period DP, the spread spectrum control circuit 120 determines whether to perform the spreading spectrum operation according to the second setting data acquired from the mode control signal CTR. That is, the second setting data is associated with the display periods DP. The spreading spectrum operation includes shifting a frequency of the first output clock signal OUT1 during each of the time units tu1 to a respective frequency of a plurality of frequencies according to the second setting data, to generate the internal clock signal CLK in one first spreading cycle SC1 which varies among the plurality of frequencies. The plurality of frequencies during the first spreading cycle SC1 may be called the first spreading frequencies. The details of the first spreading frequencies may be referred to the descriptions of the first spreading frequencies of FIG. 3B, while the details are not redundantly described seriatim herein.

During the porch period PP (touch sensing period TP), the spread spectrum control circuit 120 determines whether to perform the spreading spectrum operation according to the second setting data acquired from the mode control signal CTR. That is, the second setting data is associated with the touch sensing periods TP. The spreading spectrum operation includes shifting a frequency of the first output clock signal OUT1 during each of the time units tu2 to a respective frequency of a plurality of frequencies according to the second setting data, to generate the internal clock signal CLK in one second spreading cycle SC2 which varies among the plurality of frequencies. The plurality of frequencies during the first spreading cycle SC2 may be called the second spreading frequencies. The details of the second spreading frequencies may be referred to the descriptions of the second spreading frequencies of FIG. 3B, while the details are not redundantly described seriatim herein.

Compared to the frame period in FIG. 3B, the difference of the frame period in FIG. 4A is that during the touch sensing period TP, two second spreading cycles SC2 and one non-spreading period NSC2 are included. In addition, the implementation details of the oscillating signal of the display period DP in FIG. 4A may be referred to the descriptions of the display period DP in FIG. 3B to obtain sufficient teachings, suggestions, and implementation embodiments, while the details are not redundantly described seriatim herein. Therefore, the display quality of the touch and display driver integrated circuit does not decrease when the electromagnetic interference is reduced by the spreading spectrum operation.

During the porch period PP (touch sensing period TP), at a second time unit tu2 of a second spreading cycle SC2, according to the second setting data, the first output clock signal OUT1 is shifted (increased) from the frequency f410 to a frequency f411 (respective frequency) of the plurality of second spreading frequencies by the spread spectrum control circuit 120. Similarly, during the remaining time units tu2 of the second spreading cycle SC2, the spreading spectrum operation is performed respectively. The arrangement of the spreading frequencies of the second spreading cycle SC2 may be same as or different from the first spreading cycle SC1, and this disclosure is not limited thereto. During a next second spreading cycle SC2, the spreading spectrum operation is performed. The arrangement of the spreading frequencies of the later second spreading cycle SC2 may be same as or different from the earlier second spreading cycle SC2, and this disclosure is not limited thereto. During a second non-spreading period NSC2, the frequency of the first output clock signal OUT1 remains at the frequency f410.

With reference to FIG. 1 and FIG. 4B, the frame period is depicted again. Compared to the frame period in FIG. 4A, the difference of the frame period in FIG. 4B is that during the porch period PP (touch sensing period TP), no spreading spectrum operation is performed by the spread spectrum control circuit 120, but the frequency of the first output clock signal OUT1 is shifted from a frequency f420 to a frequency f421 according to the first setting data, by the frequency shift circuit 110. In addition, the implementation details of frequency setting of the oscillating signal of the display period DP (time t330 to time t335) in FIG. 4B may be referred to the descriptions of the display period DP in FIG. 4A to obtain sufficient teachings, suggestions, and implementation embodiments, while the details are not redundantly described seriatim herein.

It is noted that, the first setting data and the second setting data (of the mode control signal CTR) may be determined based on the communication frequency bands (e.g., communication frequency band CB1 and communication frequency band CB2) of the wireless communication transceiver, and the requirements of the display quality and the touch sensing accuracy of the touch and display driver integrated circuit according to the design needs. That is, once the communication frequency bands of the wireless communication transceiver and the touch and display driver integrated circuit are determined, the first setting data and the second setting may be predetermined.

Figures 5A, 5B, 5C:
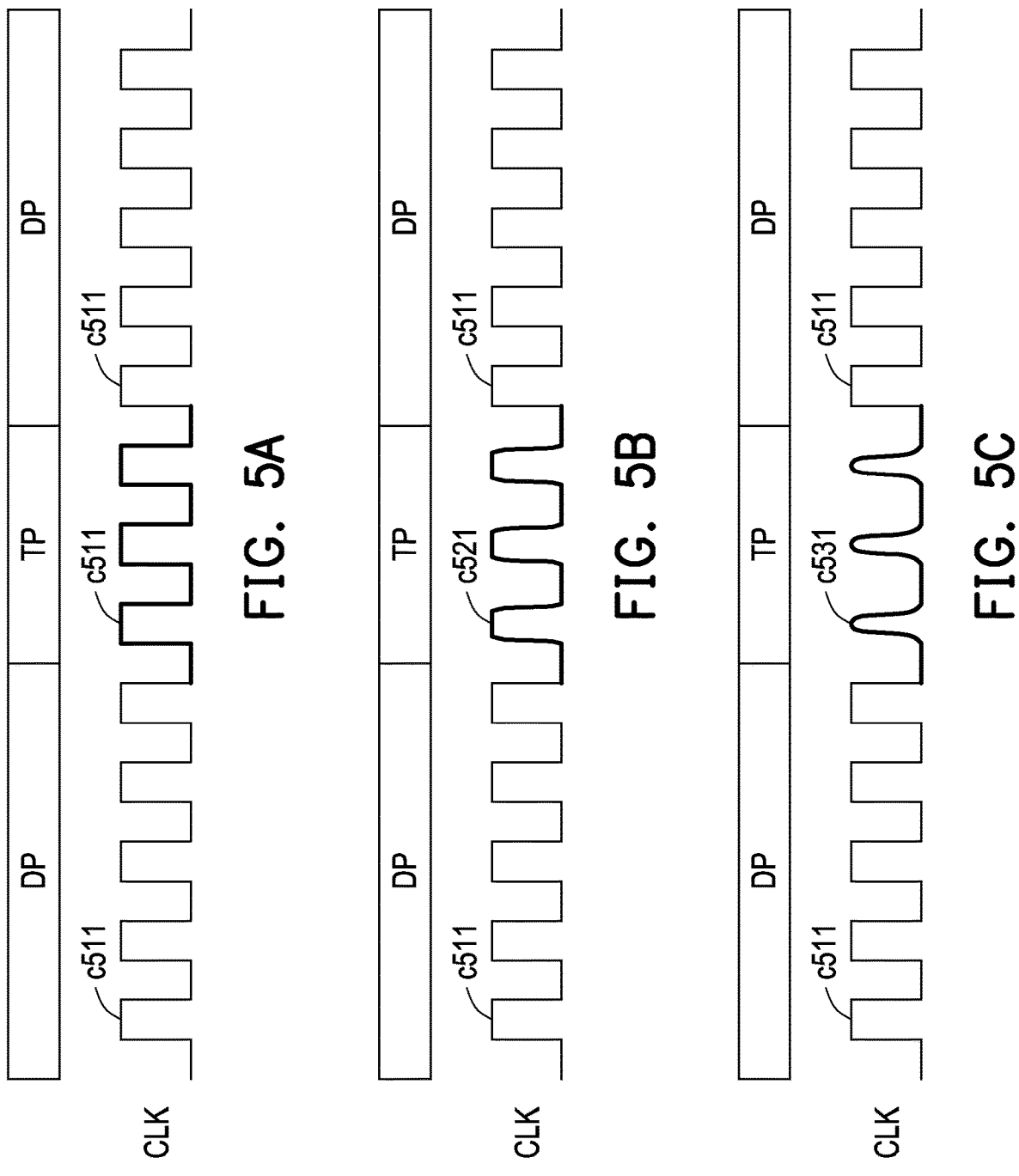
FIG. 5A is a schematic diagram of a driving ability of an oscillating signal adjusting circuit according to an embodiment of the disclosure.
FIG. 5B is a schematic diagram of a driving ability of an oscillating signal adjusting circuit according to an embodiment of the disclosure.
FIG. 5C is a schematic diagram of a driving ability of an oscillating signal adjusting circuit according to an embodiment of the disclosure.

FIG. 5A is a schematic diagram of a driving ability of an oscillating signal adjusting circuit according to an embodiment of the disclosure. FIG. 5B is a schematic diagram of a driving ability of an oscillating signal adjusting circuit according to an embodiment of the disclosure. FIG. 5C is a schematic diagram of a driving ability of an oscillating signal adjusting circuit according to an embodiment of the disclosure. In one embodiment, adjusting driving ability of a clock signal may be implemented by adjusting slew rate of the clock signal.

With reference to FIG. 5A, the internal clock signal CLK is generated by the oscillating signal adjusting circuit to have a normal driving capability c511 during display periods DP and touch sensing periods DP.

With reference to FIG. 5B, the internal clock signal CLK is generate to have the normal driving capability c511 during display periods DP and have a first driving capability c521 during touch sensing periods TP. The first driving capability c521 is lower than the normal driving capability c511.

With reference to FIG. 5C, the internal clock signal CLK is generated to have the normal driving capability c511 during display periods DP and have a second driving capability c531 during touch sensing periods TP. The second driving capability c531 is lower than the first driving capability c521.

With reference to FIG. 1 and FIG. 5A to FIG. 5C, the spread spectrum control circuit 120 adjusts a driving capability of the oscillating signal adjusting circuit 100 during the touch sensing periods TP to keep the driving capability of the oscillating signal adjusting circuit 100 during the touch sensing periods TP different from the driving capability of the oscillation oscillating signal adjusting circuit during the display periods DP. Specifically, the spread spectrum control circuit 120 may decrease the slew rate of the internal clock signal CLK during the touch sensing periods TP, so that the slew rate of the internal clock signal CLK becomes smaller than a slew rate of the internal clock signal CLK during the display periods DP. Therefore, the electromagnetic interference to an electronic device such as a mobile phone caused by the internal clock signal CLK of an oscillator in the touch and display driver IC is reduced.

Figure 6:
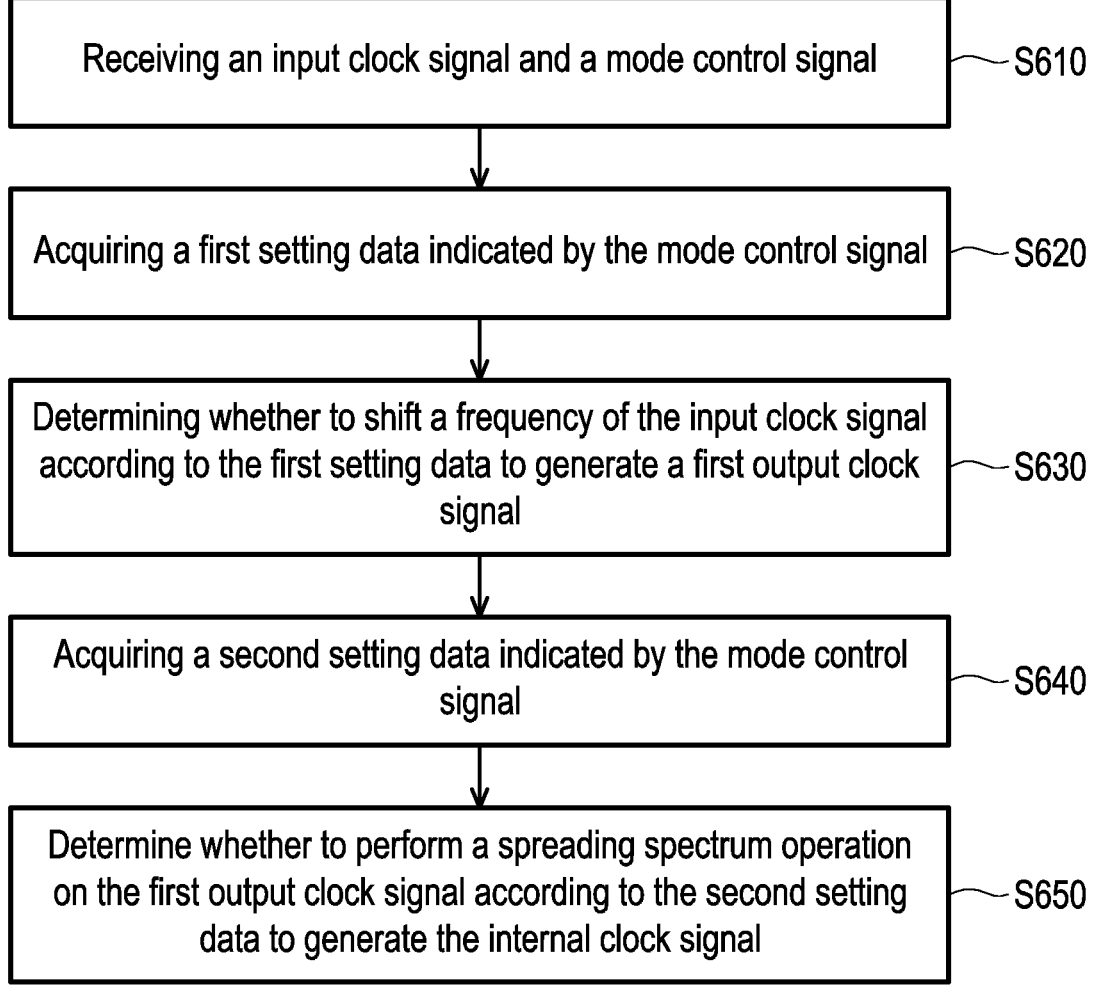
FIG. 6 is a schematic flowchart of an oscillating signal adjusting method according to an embodiment of the disclosure.

FIG. 6 is a schematic flowchart of an oscillating signal adjusting method according to an embodiment of the disclosure. With reference to FIG. 6, the oscillating signal adjusting method 600 is adapted to an oscillation circuit generating an internal clock signal of a touch and display driver integrated circuit. In addition, the implementation details of the oscillating signal adjusting method 600 may be referred to the descriptions of FIG. 1 to FIG. 5C to obtain sufficient teachings, suggestions, and implementation embodiments, while the details are not redundantly described seriatim herein.

In a step S610, an input clock signal and a mode control signal are received. In a step S620, a first setting data indicated by the mode control signal is acquired. In a step S630, whether to shift a frequency of the input clock signal according to the first setting data to generate a first output clock signal is determined. In a step S640, a second setting data indicated by the mode control signal is acquired. In a step S650, whether to perform a spreading spectrum operation on the first output clock signal according to the second setting data to generate the internal clock signal is determined. In addition, the mode control signal has a first voltage level in a display period and has a second voltage level in a touch sensing period. Details of the step S610 to step S650 have been described in the embodiments mentioned above, and no more repeated description here.

Therefore, while the oscillating signal adjusting method is implemented in an electronic device, the electromagnetic interference to an electronic device such as a mobile phone caused by the oscillating signal of an oscillator in the electronic device falling within a communication frequency band may be reduced and thereby improving the quality of the communication signals or other signals of the electronic device.

In summary, the oscillating signal adjusting circuit and the oscillating signal adjusting method are capable of reducing the electromagnetic interference to an electronic device caused by the oscillating signal of an oscillator in the electronic device falling within a communication frequency band and thereby improving the quality of the communication signals or other signals of the electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An oscillating signal adjusting circuit, adapted to generate an internal clock signal of a touch and display driver integrated circuit, comprising:

a frequency shift circuit, configured to receive an input clock signal and a mode control signal, acquire a first setting data for performing a frequency shifting operation under an operation mode which is indicated by the mode control signal, and determine whether to shift a frequency of the input clock signal according to the first setting data to generate a first output clock signal; and a spread spectrum control circuit, coupled to the frequency shift circuit, configured to receive the first output clock signal and the mode control signal, acquire a second setting data for performing a spreading spectrum operation under the operation mode which is indicated by the mode control signal, and determine whether to perform the spreading spectrum operation on the first output clock signal according to the second setting data to generate the internal clock signal;

wherein the mode control signal having a first voltage level in display periods indicates that the touch and display driver integrated circuit is operating in a display mode and the mode control signal having a second voltage level in touch sensing periods indicates that the touch and display driver integrated circuit is operating in a touch sensing mode.

2. The oscillating signal adjusting circuit as claimed in claim 1, wherein in a frame period comprising a plurality of display periods and a plurality of touch sensing periods alternatively arranged, the frequency shift circuit determines whether to shift the frequency of the input clock signal during the display periods of each frame period according to the first setting data and determines whether to shift the frequency of the input clock signal during the touch sensing periods of each frame period according to the first setting data.

3. The oscillating signal adjusting circuit as claimed in claim 1, wherein in a frame period comprising a plurality of display periods and a plurality of touch sensing periods alternatively arranged, at least one of the display periods comprises a plurality of first spreading cycles and a first non-spreading period, wherein each of the first spreading cycle comprises a plurality of time units and the first non-spreading period is shorter than each of the first spreading cycles.

4. The oscillating signal adjusting circuit as claimed in claim 3, wherein the spread spectrum control circuit determines whether to perform the spreading spectrum operation including shifting a frequency of the first output clock signal during each of the time units to a respective frequency of a plurality of frequencies according to the second setting data, such that the internal clock signal in one first spreading cycle varies among the plurality of frequencies.

5. The oscillating signal adjusting circuit as claimed in claim 1, wherein in a frame period comprising a plurality of display periods and a plurality of touch sensing periods alternatively arranged, at least one of the touch sensing periods comprises at least one second spreading cycle, and the second spreading cycle comprises a plurality of time units.

6. The oscillating signal adjusting circuit as claimed in claim 5, wherein the spread spectrum control circuit determines whether to perform the spreading spectrum operation including shifting a frequency of the first output clock signal during each of the time units to a respective frequency of a plurality of frequencies according to the second setting data, such that the internal clock signal in one second spreading cycle varies among the plurality of frequencies.

7. The oscillating signal adjusting circuit as claimed in claim 1, wherein in a frame period comprising a display period and a porch period as a touch sensing period, the frequency shift circuit determines whether to shift the frequency of the input clock signal during the display period according to the first setting data and determines whether to shift the frequency of the input clock signal during the touch sensing period according to the first setting data.

8. The oscillating signal adjusting circuit as claimed in claim 1, wherein in a frame period comprising a display period and a porch period as a touch sensing period, the display period comprises a plurality of first spreading cycles and a first non-spreading period, each of the first spreading cycle comprises a plurality of time units, and the first non-spreading period is shorter than each of the first spreading cycles.

9. The oscillating signal adjusting circuit as claimed in claim 8, wherein the spread spectrum control circuit determines whether to perform the spreading spectrum operation including shifting a frequency of the first output clock signal during each of the time units to a respective frequency of a plurality of frequencies according to the second setting data, such that the internal clock signal in one first spreading cycle varies among the plurality of frequencies.

10. The oscillating signal adjusting circuit as claimed in claim 1, wherein in a frame period comprising a display period and a porch period as a touch sensing period, the touch sensing period comprises a plurality of second spreading cycles and a second non-spreading period, each of the second spreading cycle comprises a plurality of time units, and wherein the second non-spreading period is shorter than each of the second spreading cycles.

11. The oscillating signal adjusting circuit as claimed in claim 10, wherein the spread spectrum control circuit determines whether to perform the spreading spectrum operation including shifting a frequency of the first output clock signal during each of the time units to a respective frequency of a plurality of frequencies according to the second setting data, such that the internal clock signal in one second spreading cycle varies among the plurality of frequencies.

12. The oscillating signal adjusting circuit as claimed in claim 1, wherein the spread spectrum control circuit adjusts a driving capability of the oscillating signal adjusting circuit during the touch sensing periods to keep the driving capability of the oscillating signal adjusting circuit during the touch sensing periods different from the driving capability of the oscillating signal adjusting circuit during the display periods.

13. The oscillating signal adjusting circuit as claimed in claim 1, wherein a voltage level of the mode control signal alternates between a high level and a low level, periods of the mode control signal staying in one of the high level and the low level indicates the display periods, and periods of the mode control signal staying in the other one of the high level and the low level indicates the touch sensing periods.

14. An oscillating signal adjustment method, adapted to an oscillation circuit generating an internal clock signal of a touch and display driver integrated circuit, comprising:
    receiving an input clock signal and a mode control signal;
    acquiring a first setting data for performing a frequency shifting operation under an operation mode which is indicated by the mode control signal;

determining whether to shift a frequency of the input clock signal according to the first setting data to generate a first output clock signal;
acquiring a second setting data for performing a spreading spectrum operation under the operation mode which is indicated by the mode control signal; and
determine whether to perform the spreading spectrum operation on the first output clock signal according to the second setting data to generate the internal clock signal,
wherein the mode control signal having a first voltage level in display periods indicates that the touch and display driver integrated circuit is operating in a display mode and the mode control signal having a second voltage level in touch sensing periods indicates that the touch and display driver integrated circuit is operating in a touch sensing mode.

15. The oscillating signal adjustment method as claimed in claim 14, wherein determining whether to shift the frequency of the input clock signal according to the first setting data to generate the first output clock signal further comprises:
    determining whether to shift the frequency of the input clock signal according to the first setting data during a plurality of display periods of a frame period comprising the plurality of display periods and a plurality of touch sensing periods alternatively arranged; and
    determining whether to shift the frequency of the input clock signal according to the first setting data during the touch sensing periods of the frame period.

16. The oscillating signal adjustment method as claimed in claim 14, wherein in a frame period comprising a plurality of display periods and a plurality of touch sensing periods alternatively arranged, at least one of the display periods comprises a plurality of first spreading cycles and a first non-spreading period, wherein each of the first spreading cycle comprises a plurality of time units and the first non-spreading period is shorter than each of the first spreading cycles.

17. The spread method as claimed in claim 16, wherein the spreading spectrum operation further comprises:
    shifting a frequency of the first output clock signal during each of the time units to a respective frequency of a plurality of frequencies according to the second setting data, such that the internal clock signal in one first spreading cycle varies among the plurality of frequencies.

18. The oscillating signal adjustment method as claimed in claim 14, wherein in a frame period comprising a plurality of display periods and a plurality of touch sensing periods alternatively arranged, at least one of the touch sensing periods comprises at least one second spreading cycle, and the second spreading cycle comprises a plurality of time units.

19. The oscillating signal adjustment method as claimed in claim 18, wherein the spreading spectrum operation further comprises:
    shifting a frequency of the first output clock signal during each of the time units to a respective frequency of a plurality of frequencies according to the second setting data, such that the internal clock signal in one second spreading cycle varies among the plurality of frequencies.

20. The oscillating signal adjustment method as claimed in claim 14, wherein determining whether to shift a frequency of the input clock signal according to the first setting data to generate a first output clock signal further comprises:

determining whether to shift the frequency of the input clock signal during the display period according to the first setting data in a frame period comprising a display period and a porch period as a touch sensing period; and determining whether to shift the frequency of the input clock signal during the touch sensing period according to the first setting data.

21. The oscillating signal adjustment method as claimed in claim 14, wherein in a frame period comprising a display period and a porch period as a touch sensing period, the display period comprises a plurality of first spreading cycles and a first non-spreading period, each of the first spreading cycle comprises a plurality of time units, and the first non-spreading period is shorter than each of the first spreading cycles.

22. The oscillating signal adjustment method as claimed in claim 21, wherein the spreading spectrum operation further comprises:

shifting a frequency of the first output clock signal during each of the time units to a respective frequency of a plurality of frequencies according to the second setting data, such that the internal clock signal in one first spreading cycle varies among the plurality of frequencies.

23. The oscillating signal adjustment method as claimed in claim 14, wherein in a frame period comprising a display period and a porch period as a touch sensing period, the touch sensing period comprises a plurality of second spreading cycles and a second non-spreading period, each of the second spreading cycle comprises a plurality of time units, and wherein the second non-spreading period is shorter than each of the second spreading cycles.

24. The oscillating signal adjustment method as claimed in claim 23, wherein the spreading spectrum operation further comprises:

shifting a frequency of the first output clock signal during each of the time units to a respective frequency of a plurality of frequencies according to the second setting data, such that the internal clock signal in one second spreading cycle varies among the plurality of frequencies.

25. The oscillating signal adjustment method as claimed in claim 14, further comprising:

adjusting a driving capability of the oscillation circuit during the touch sensing periods to keep the driving capability of the oscillation circuit during the touch sensing periods different from the driving capability of the oscillation circuit during the display periods.

26. The oscillating signal adjustment method as claimed in claim 14, wherein a voltage level of the mode control signal alternates between a high level and a low level, periods of the mode control signal staying in one of the high level and the low level indicates the display periods, and periods of the mode control signal staying in the other one of the high level and the low level indicates the touch sensing periods.

* * * * *